(12) United States Patent
Kawagoe

(10) Patent No.: US 8,907,711 B2
(45) Date of Patent: Dec. 9, 2014

(54) INTEGRATED CIRCUIT HAVING LATCH CIRCUITS AND USING DELAY CIRCUITS TO FETCH DATA BITS IN SYNCHRONIZATION WITH CLOCK SIGNALS

(71) Applicant: Lapis Semiconductor Co., Ltd., Tokyo (JP)

(72) Inventor: Masakuni Kawagoe, Miyazaki (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 14/068,066

(22) Filed: Oct. 31, 2013

(65) Prior Publication Data
US 2014/0055185 A1    Feb. 27, 2014

Related U.S. Application Data

(62) Division of application No. 13/362,414, filed on Jan. 31, 2012, now Pat. No. 8,601,427.

(30) Foreign Application Priority Data

Feb. 9, 2011    (JP) .................................. 2011-025807

(51) Int. Cl.
| | |
|---|---|
| *H03K 3/00* | (2006.01) |
| *H03K 5/13* | (2014.01) |
| *H03L 7/00* | (2006.01) |
| *G06F 17/50* | (2006.01) |
| *H03K 3/037* | (2006.01) |

(52) U.S. Cl.
CPC .............. *H03L 7/00* (2013.01); *G06F 17/5059* (2013.01); *H03K 5/133* (2013.01); *H03K 3/0375* (2013.01)

USPC ............. 327/295; 327/161; 326/93; 716/135; 713/401; 713/503

(58) Field of Classification Search
USPC ......... 327/161, 160, 141, 144, 153, 291–297, 327/231–237, 239, 242, 250–253, 258, 327/259; 326/93–98; 716/132–135; 713/400, 401, 500–503
See application file for complete search history.

(56) References Cited

U.S. PATENT DOCUMENTS

| | | | |
|---|---|---|---|
| 5,396,129 A | * | 3/1995 | Tabira .............................. 326/93 |
| 5,726,990 A | | 3/1998 | Shimada et al. |

(Continued)

FOREIGN PATENT DOCUMENTS

| | | |
|---|---|---|
| JP | 03-065748 | 3/1991 |
| JP | 04-120771 | 4/1992 |

(Continued)

OTHER PUBLICATIONS

Japanese Office Action dated Oct. 21, 2014.

*Primary Examiner* — Lincoln Donovan
*Assistant Examiner* — Thomas Skibinski
(74) *Attorney, Agent, or Firm* — Volentine & Whitt, PLLC

(57) ABSTRACT

A semiconductor integrated circuit includes a delay circuit connected between a source of data bits and a data input terminal of a latch circuit. The delay circuit includes a first delay section formed by connecting logic devices in series corresponding to a number of logic devices included in a clock signal path between a clock signal source and the latch circuit data input. The delay circuit also includes a second delay section having a delay time equal to an interconnect delay time corresponding to a wiring length of the clock signal path.

4 Claims, 11 Drawing Sheets

(56) References Cited

U.S. PATENT DOCUMENTS

| | | |
|---|---|---|
| 6,111,446 A | 8/2000 | Keeth |
| 6,166,990 A | 12/2000 | Ooishi et al. |
| 6,212,127 B1 | 4/2001 | Funaba et al. |
| 6,282,210 B1 | 8/2001 | Rapport et al. |
| 6,313,673 B1 | 11/2001 | Watanabe |
| 6,484,268 B2 | 11/2002 | Tamura et al. |
| 6,650,575 B1 | 11/2003 | Khanna |
| 6,774,693 B2 | 8/2004 | Carr |
| 6,943,610 B2 | 9/2005 | Saint-Laurent |
| 7,085,336 B2 * | 8/2006 | Lee et al. .................. 375/354 |
| 7,332,916 B2 | 2/2008 | Nagata |
| 7,394,641 B2 * | 7/2008 | Won et al. .................. 361/277 |
| 7,719,314 B1 * | 5/2010 | Jiang et al. .................. 326/83 |
| 7,990,786 B2 | 8/2011 | Chu et al. |
| 8,189,723 B2 | 5/2012 | Berhanu et al. |
| 2005/0225365 A1 | 10/2005 | Wood |
| 2010/0039157 A1 | 2/2010 | Kaeriyama et al. |

FOREIGN PATENT DOCUMENTS

| | | |
|---|---|---|
| JP | 07-0662963 | 3/1995 |
| JP | 11-261408 | 9/1999 |
| JP | 2000-322885 | 11/2000 |
| JP | 2002-313937 | 10/2002 |
| JP | 2006-165099 | 6/2006 |
| JP | 2006-278785 | 10/2006 |
| JP | 2007-183887 | 7/2007 |

* cited by examiner

INTEGRATED CIRCUIT HAVING LATCH CIRCUITS AND USING DELAY CIRCUITS TO FETCH DATA BITS IN SYNCHRONIZATION WITH CLOCK SIGNALS

CROSS-REFERENCE TO RELATED APPLICATION

This application is a divisional application of application Ser. No. 13/362,414 filed Jan. 31, 2012, now U.S. Pat. No. 8,601,427, which is hereby incorporated for all purposes. This application claims priority under 35 USC 119 from Japanese Patent Application No. 2011-025807, the disclosure of which is incorporated by reference herein.

FIELD OF THE INVENTION

The present invention relates to a semiconductor integrated circuit, and in particular, a semiconductor integrated circuit including a latch circuit for fetching data bits in synchronization with clock signals, a semiconductor chip and a method for designing the semiconductor integrated circuit.

DESCRIPTION OF THE RELATED ART

In flip flop circuits (hereinafter, referred to as FFs) serving as latch circuits on a semiconductor integrated circuit (IC) chip, edge timings of clock signals supplied to the respective FFs may not match each other due to manufacture variations and interconnect delays, which is called "clock skew." Due to the clock skew, the data retention time (i.e., the data hold time) required for fetching the data may be insufficient at those FFs which receive the clock signal at a delayed timing. In such case, the FFs may erroneously fetch the data. Also, the time for preventing the last-fetched data from being fetched again (i.e., the setup time) may be insufficient at those FFs which receive the clock signal at a timing earlier than the scheduled timing. In such case, again, FFs may erroneously fetch the data.

To deal with these problems, there is known a method for forming a clock tree. In this clock tree approach, a hold time is measured at each path between FFs when deciding a layout design of various devices and elements, including the FFs, on an IC circuit. A buffer serving as a delay circuit is inserted into a clock signal line and/or a clock branch path is added to the clock signal line in such a manner that the hold time can stay within a desired range (see, for example, paragraphs [0034] and [0035] and FIG. 5 of Japanese Patent Application Publication (Kokai) No. 2007-183887).

However, the clock tree approach requires a complicated arithmetic processing and calculation to prepare the clock tree. In addition, if the inserted buffer has a great delay time, a layout area for the buffer may increase.

SUMMARY OF THE INVENTION

An object of the present invention is to provide a semiconductor integrated circuit, which can be designed with a small-size structure and can reduce or eliminate a clock skew.

Another object of the present invention is to provide a semiconductor chip, which can be designed with a small-size structure and can reduce or eliminate the clock skew.

Still another object of the present invention is to provide a method of designing the semiconductor integrated circuit with a small-size structure and with no or reduced clock skew.

According to one aspect of the present invention, there is provided an improved semiconductor integrated circuit. The semiconductor integrated circuit includes a latch circuit to fetch data bits in synchronization with clock signals. The semiconductor integrated circuit also includes a delay circuit connected between a source of the data bits and a data input terminal of the latch circuit. The semiconductor integrated circuit also includes a clock signal path (wiring) for transmitting a clock signal from a source of the clock signals to a clock input terminal of the latch circuit. The delay circuit has a first delay section formed by connecting a plurality of logic devices in series. The number of these logic devices is equal to a number of logic devices included in the clock signal path. The delay circuit also has a second delay section having a delay time equal to an interconnect delay time (delay time caused by wiring) corresponding to a wiring length in the clock signal path.

According to another aspect of the present invention, there is provided a semiconductor chip. The semiconductor chip includes a latch circuit to fetch data bits in synchronization with clock signals. The semiconductor chip also includes a data pad arranged along an outer periphery of the semiconductor chip. The semiconductor chip also includes a clock pad arranged along the outer periphery of the semiconductor chip. The semiconductor chip also includes a clock line (wiring) to connect the latch circuit with the clock pad. The semiconductor chip also includes a data line (wiring) to connect the latch circuit with the data pad. The semiconductor chip also includes a first waveform correction (shaping) device connected between the latch circuit and the clock pad. The semiconductor chip also includes a second waveform correction (shaping) device connected between the latch circuit and the data pad. The semiconductor chip also includes a delay circuit connected between the latch circuit and the data pad and having (creating) a delay corresponding to an amount of charge/discharge current supplied to a capacitor. The semiconductor chip also includes a ground line connected to one end of the capacitor. The ground line extends along an edge of the outer periphery of the semiconductor chip at a region between the data pad and the delay circuit.

According to still another aspect of the present invention, there is provided a method of designing a semiconductor integrated circuit including a latch circuit to fetch data bits in synchronization with clock signals. The method includes the step of arranging a data pad, a clock pad, a clock line, a data line, a first waveform correction (shaping) device, a second waveform correction (shaping) device, the latch circuit, and a delay circuit. The delay circuit causes (creates) a delay corresponding to an amount of charge/discharge current supplied to a capacitor. The method also includes the step of determining a capacitance of the capacitor and/or the amount of charge/discharge current supplied to the capacitor corresponding to an amount of delay based on a wiring length of the clock line. The method also includes the step of calculating a constant current bias voltage and/or a layout (shape) of the capacitor based on the capacitance of the capacitor and/or the amount of charge/discharge current supplied to the capacitor. The method also includes the step of arranging and/or position-adjusting (modifying) the capacitor and/or a circuit generating the constant current bias voltage based on the calculated constant current bias voltage and/or the calculated layout (shape) of the capacitor.

In the semiconductor integrated circuit of the invention, the first delay section is provided between the data bit source and the latch circuit data input by connecting logic devices in series corresponding to the number of logic devices, which are included in the clock signal path extending between the clock signal source and the latch circuit clock input. The second delay section is also provided between the data bit source and the latch circuit data input, and has the delay time equal to the interconnect delay time corresponding to the wiring length of the clock signal path. The clock skew caused by the delay time of the logic devices included in the clock signal path can be reduced (or eliminated) by the first delay section, and the clock skew caused by the interconnect delay time in the clock signal path can be reduced (or eliminated) by the second delay section.

According to the semiconductor integrated circuit of the invention, a sufficient margin for the setup time and the hold time can be ensured without providing the clock tree structure required to reduce the clock skew, or without the complicated design for matching the data line length between the data bit source and the latch circuit with the clock line length. The number of logic devices to be connected to each other in series as a delay unit does not become large because it is not necessary to provide a large number of logic devices to make the clock tree for reduction of the clock skew. Also, the data line length does not become long with the clock line length. Thus, the area occupied by the chips is reduced as compared with a technology employing the clock tree.

These and other objects, aspects and advantages of the invention will become apparent to those skilled in the art from the following detailed description when read and understood in conjunction with the appended claims and drawings.

DETAILED DESCRIPTION OF THE INVENTION

A delay circuit according to an exemplary embodiment of the invention includes a first delay section and a second delay section having the structure as described below, and is installed between a data input terminal of a latch circuit for fetching data bits in synchronization with clock signals and a source of data bits. The first delay section can be formed by connecting logic devices in series corresponding to the number of logic devices included in the clock signal path extending between the source of the clock signals and the clock input terminal of the latch circuit. The second delay section has the delay time equal to the interconnect delay time corresponding to the wiring length of the clock signal path.

Figure 1:
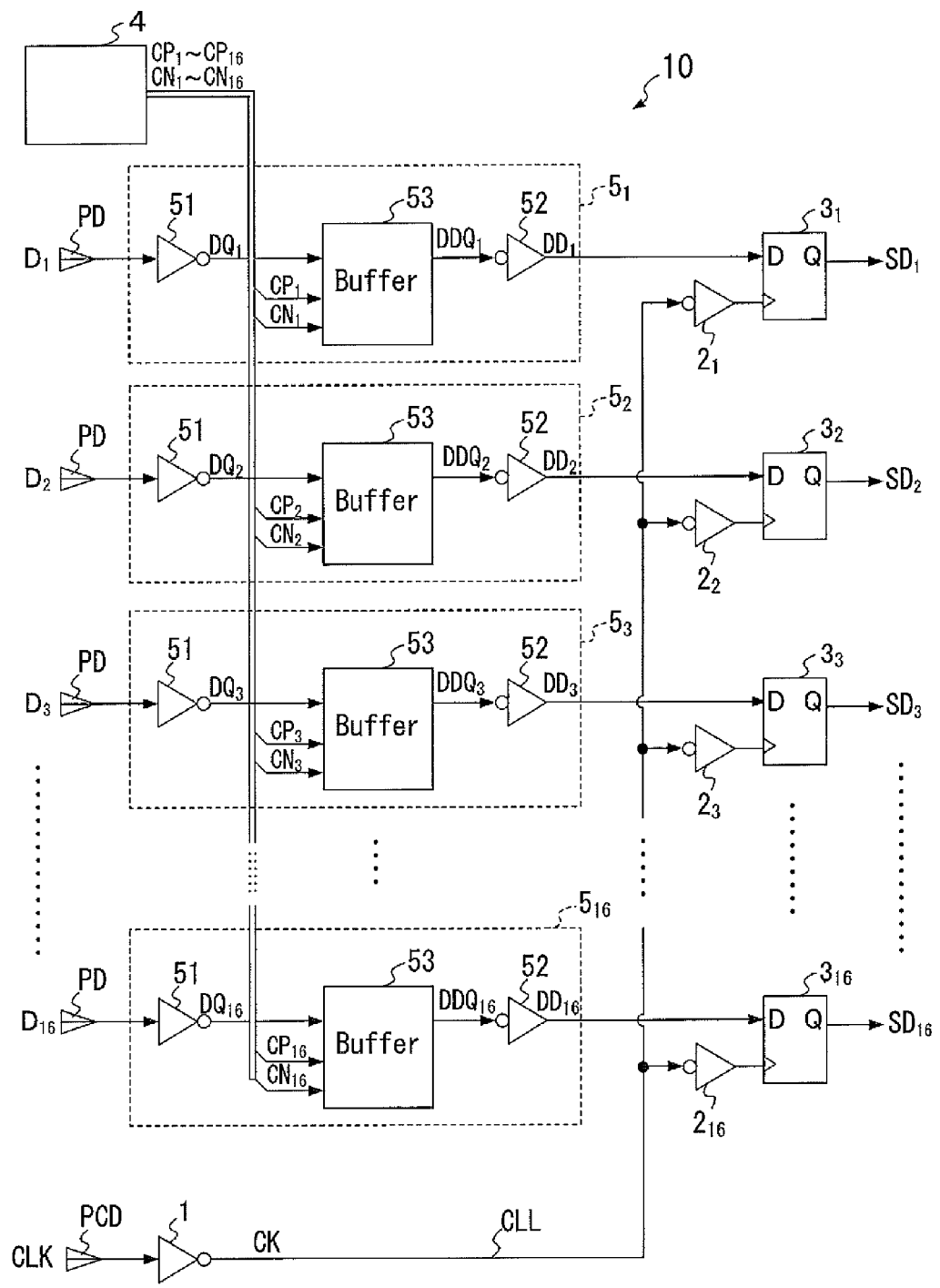
FIG. 1 is a circuit diagram showing a data fetch section in a semiconductor integrated circuit according to one embodiment of the present invention.

Referring to FIG. 1, illustrated is the structure of a data fetch section 10 in a semiconductor integrated circuit according to one embodiment of the present invention.

The data fetch section 10 shown in FIG. 1 fetches 16 input data bits $D_1$ to $D_{16}$ at the rising edge timing of a clock signal CLK.

As shown in FIG. 1, the data fetch section 10 includes a first inverter 1, second inverters $2_1$ to $2_{16}$, FFs (flip-flops) $3_1$ to $3_{16}$, a delay time setting part 4 and delay circuits $5_1$ to $5_{16}$. FF $3_i$ is a latch circuit.

The first inverter 1 supplies a reverse clock signal CK, which is obtained by reversing a logic level of an input clock signal CLK received from the outside through a clock pad PCD serving as an external connection terminal of a semiconductor chip, to each of the inverters $2_1$ to $2_{16}$ through a clock line CLL. The clock line CLL has a plurality of sublines connecting to (branching to) the FF $3_1$ to $3_{16}$ through the associated inverters $2_1$ to $2_{16}$ thereby defining a plurality of clock wiring lengths. The clock wiring lengths are different from each other. The inverter 1 is disposed adjacent to a clock pad PCD serving as a source of the input clock signal CLK.

The second inverters $2_1$ to $2_{16}$ supply a clock signal, which is obtained by reversing a logic level of the reverse clock signal CK, to clock input terminals of the FFs $3_1$ to $3_{16}$. The inverters $2_1$ to $2_{16}$ are disposed adjacent to the clock input terminals of the FFs $3_1$ to $3_{16}$, respectively.

The inverter 1 and inverters $2_1$ to $2_{16}$ have the waveform correction (shaping) functions.

The delay circuits $5_1$ to $5_{16}$ have the same internal structure. Each delay circuit 5 includes inverters 51 and 52 and a variable delay buffer 53, as shown in FIG. 1.

The inverter 51 supplies a reverse bit signal DQ, which is obtained by reversing a logic level of an input data bit D received from an associated data pad PD serving as an external connection terminal of the semiconductor chip, to the variable delay buffer 53. The inverter 51 has the processing time (hereinafter, referred to as "delay time") the same as that of the inverter 1 included in the clock signal path, and is disposed adjacent to the data pad PD serving as a source for input data bit D.

The variable delay buffer 53 supplies a delay reverse bit signal DDQ, which is obtained by delaying the reverse bit signal DQ, to the inverter 52. In the variable delay buffer 53, the amount of delay to delay the reverse bit signal DQ may be changed on the basis of the constant current bias voltages CP and CN serving as delay control voltages received from the delay time setting part 4. The inverter 52 supplies a delay data bit DD, which is obtained by reversing a logic level of the delay reverse bit signal DDQ received from the variable delay buffer 53, to a data input terminal of the FF 3. The inverter 52 has the delay time substantially the same as that of the inverter 2 included in the clock signal path. The inverters 2 and 52 may be formed through the same process to have the same device size. Thus, variations in manufacture can be kept in a tolerable range. The inverters 1 and 2 may be referred to as a first wave shaping element, the inverters 51 and 52 may be referred to as a second wave shaping element, and the buffer 53 may be referred to as a delay circuit.

The FF 3 is a latch circuit in this embodiment. The FFs $3_1$ to $3_{16}$ fetch delay data bits $DD_1$ to $DD_{16}$, which are received from the corresponding delay circuits $5_1$ to $5_{16}$, at every rising edge timing of the clock signal received through the inverters $2_1$ to $2_{16}$ to issue the delay data bits $DD_1$ to $DD_{16}$ as fetch data $SD_1$ to $SD_{16}$.

The delay time setting part 4 generates constant current bias voltages $CP_1$ to $CP_{16}$ and $CN_1$ to $CN_{16}$ as delay time control voltages for adjusting the delay times of the delay circuits $5_1$ to $5_{16}$, respectively, and supplies the constant current bias voltages $CP_1$ to $CP_{16}$ and $CN_1$ to $CN_{16}$ to the variable delay buffers 53 of the delay circuits $5_1$ to $5_{16}$, respectively. The delay time setting part 4 supplies the constant current bias voltages $CP_1$ and $CN_1$ to the variable delay buffer 53 of the delay circuit $5_1$, the constant current bias voltages $CP_2$ and $CN_2$ to the variable delay buffer 53 of the delay circuit $5_2$, and the constant current bias voltages $CP_3$ and $CN_3$ to the variable delay buffer 53 of the delay circuit $5_3$.

The values of the constant current bias voltages $CP_1$ to $CP_{16}$ and $CN_1$ to $CN_{16}$ to be generated by the delay time setting part 4 are preset through the chip layout processing (which will be described later) in the design process. Specifically, the delay time (referred to as interconnect delay time) caused by an interconnect resistance and parasitic capacitance, which change with the wiring length of the clock line CLL, is calculated for every FF $3_1$ to $3_{16}$ through the chip layout processing. Then, the delay time setting part 4 is preset to generate the constant current bias voltages $CP_1$ to $CP_{16}$ and $CN_1$ to $CN_{16}$ based on the delay time calculated for every FF 3.

It should be noted that the delay time setting part 4 may have any suitable configuration that can set the constant current bias voltages $CP_1$ to $CP_{16}$ and $CN_1$ to $CN_{16}$ on the basis of the external control signals. In this case, the values of the constant current bias voltages may not be preset, but may be set when necessary. Also, the values of the constant current bias voltages may be changed when such change is necessary.

Figure 2:
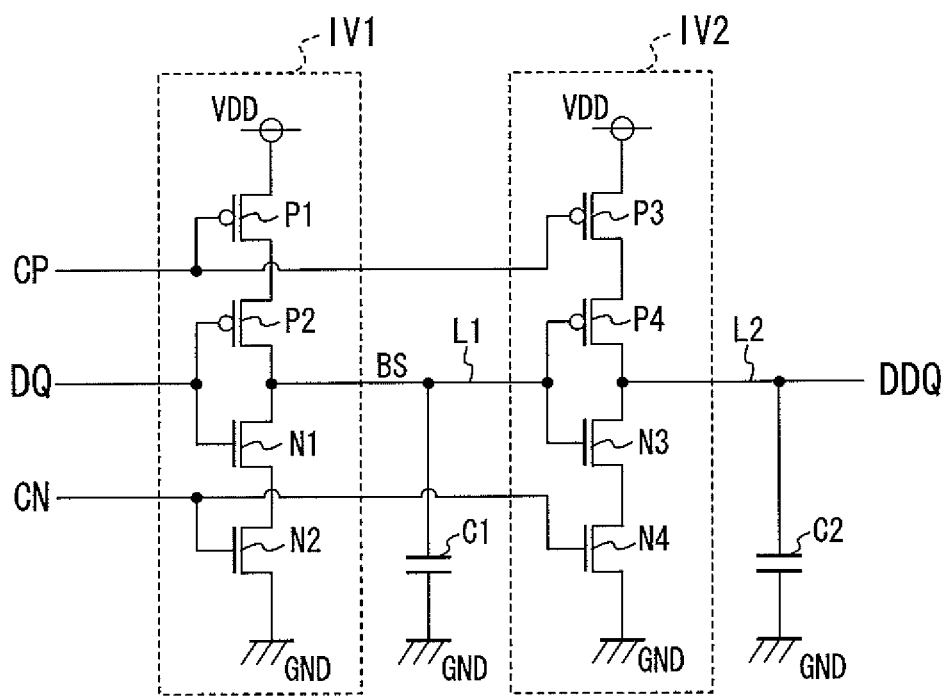
FIG. 2 is a circuit diagram showing an internal structure of a variable delay buffer included in the semiconductor integrated circuit shown in FIG. 1.

Referring now to FIG. 2, the internal configuration of the variable delay buffer 53 will be described.

As shown in FIG. 2, the variable delay buffer 53 includes variable delay inverters IV1 and IV2 and capacitors C1 and C2.

The variable delay inverter IV1 has transistors P1 and P2, which are p-channel MOSFETs (metal-oxide semiconductor field effect transistors), and transistors N1 and N2, which are n-channel MOSFETs.

A constant current bias voltage CP is supplied to a gate terminal of the transistor P1, a power source voltage VDD is applied to a source terminal of the transistor P1, and a drain terminal of the transistor P1 is connected to a source terminal of the transistor P2. The transistor P1 generates a current corresponding to the constant current bias voltage CP and transmits the current to the source terminal of the transistor P2 through a drain terminal of the transistor P1. The reverse bit signal DQ transmitted from the inverter 51 is applied to a gate terminal of the transistor P2, and a drain terminal of the transistor P2 is connected to a line L1. The transistor P2 is turned off when the reverse bit signal DQ has a level corresponding to the logic level of 1 and turned on when the reverse bit signal DQ has a level corresponding to the logic level of 0 to connect the drain terminal of the transistor P1 with the line L1. Thus, when the transistor P2 is in the on condition, the supply voltage VDD corresponding to the logic level of 1 is applied to the line L1. A constant current bias voltage CN is supplied to a gate terminal of the transistor N2, a ground voltage GND is applied to a source terminal of the transistor N2, and a drain terminal of the transistor N2 is connected to a source terminal of the transistor N1. A current corresponding to the constant current bias voltage CN is applied to the transistor N2, and the transistor N2 issues the current through a source terminal thereof. The reverse bit signal DQ transmitted from the inverter 51 is applied to a gate terminal of the transistor N1, and a drain terminal of the transistor N1 is connected to the line L1. The transistor N1 is turned off when the reverse bit signal DQ has a level corresponding to the logic level of 0, and turned on when the reverse bit signal DQ has a level corresponding to the logic level of 1 to connect the drain terminal of the transistor N2 with the line L1. Thus, when the transistor N2 is in the on condition, the ground voltage GND corresponding to the logic level of 0 is applied to the line L1. One end of the capacitor C1 is connected to the line L1 and the ground voltage GND is always applied to the other end of the capacitor C1.

According to the above-described structure, the variable delay inverter IV1 transmits a signal, which is obtained by reversing the logic level of the reverse bit signal DQ, to the line L1. The current corresponding to the constant current bias voltages CP and CN flows to the line L1 through the transistors P1 and P2 or N1 and N2 to charge or discharge the capacitor C1 connected to the line L1. That is, the variable delay inverter IV1 reverses the logic level of the supplied signal and serves as a charge/discharge controller that controls the charge/discharge operation of the capacitor C1. As the amount of the current flowing through the line L1 corresponding to the constant current bias voltages CP and CN is reduced, the charge/discharge time of the capacitor C1 may be lengthened, so that the delay may occur at the rising edge and the falling edge of the signal transmitted to the line L1. Thus, the signal, which is obtained by reversing the logic level of the reverse bit signal DQ and transmitted to the line L1 from the variable delay inverter IV1, undergoes the time delay corresponding to the charge/discharge time and then is transmitted to the variable delay inverter IV2 in the next stage as a bit signal BS. The constant current bias voltages CP and CN having the delay time corresponding to ½ of the delay time caused by the clock line CLL are supplied to the variable delay inverter IV1.

In this manner, as the reverse bit signal DQ is supplied, the variable delay inverter IV1 and the capacitor C1 supply the signal, which is obtained by reversing the logic level of the reverse bit signal DQ, to the variable delay inverter IV2 as the bit signal BS after delaying the signal by a half of the clock line CLL delay time.

The variable delay inverter IV1 may include transistors P3 and P4, which are p-channel MOSFETs, and transistors N3 and N4, which are n-channel MOSFETs.

A constant current bias voltage CP is supplied to a gate terminal of the transistor P3 as a constant current bias, a supply voltage VDD is applied to a source terminal of the transistor P3, and a drain terminal of the transistor P3 is connected to a source terminal of the transistor P4. The transistor P3 generates a current corresponding to the constant current bias voltage CP and transmits the current to the source terminal of the transistor P4 from a drain terminal of the transistor P3. The bit signal BS transmitted from the variable delay inverter IV2 is applied to a gate terminal of the transistor P4, and a drain terminal of the transistor P4 is connected to a line L2. The transistor P4 is turned off when the bit signal BS has a level corresponding to the logic level of 1 and turned on when the bit signal BS has a level corresponding to the logic level of 0 to connect the drain terminal of the transistor P3 with the line L2. That is, when the transistor P4 is in the on condition, the supply voltage VDD corresponding to the logic level of 1 is applied to the line L2. A constant current bias voltage CN is supplied to a gate terminal of the transistor N4, a ground voltage GND is applied to a source terminal of the transistor N4, and a drain terminal of the transistor N4 is connected to a source terminal of the transistor N3. A current corresponding to the constant current bias voltage CN is applied to the transistor N4 and the transistor N4 transmits the current from a source terminal thereof. The bit signal BS transmitted from the variable delay inverter IV2 is applied to a gate terminal of the transistor N3, and a drain terminal of the transistor N3 is connected to the line L2. The transistor N3 is turned off when the bit signal BS has a level corresponding to the logic level of 0 and turned on when the bit signal BS has a level corresponding to the logic level of 1 to connect the drain terminal of the transistor N4 with the line L2. That is, when the transistor N4 is in the on condition, the ground voltage GND corresponding to the logic level of 0 is applied to the line L2. One end of the capacitor C2 is connected to the line L2 and the ground voltage GND is applied to the other end of the capacitor C2.

According to the above-described structure, the variable delay inverter IV2 transmits a signal, which is obtained by reversing the logic level of the bit signal BS, to the line L2. The current corresponding to the constant current bias voltages CP and CN flows to the line L2 through the transistors P3 and P4 or N3 and N4 to charge or discharge the capacitor C2 connected to the line L2. That is, the variable delay inverter IV2 reverses the logic level of the supplied signal and serves as a charge/discharge controller that controls the charge/discharge operation of the capacitor C2. As the amount of the current flowing through the line L2 corresponding to the constant current bias voltages CP and CN is reduced, the charge/discharge time of the capacitor C2 may be lengthened, so that the delay may occur at the rising edge and the falling edge of the signal transmitted to the line L2. Thus, the signal, which is obtained by reversing the logic level of the bit signal BS and transmitted to the line L2 from the variable delay inverter IV2, undergoes the time delay corresponding to the charge/discharge time and then is transmitted to the inverter 52 in the next stage as a delayed reverse bit signal DDQ. The constant current bias voltages CP and CN having the delay time corresponding to ½ of the delay time caused by the clock line CLL are supplied to the variable delay inverter IV2.

In this manner, as the bit signal BS is supplied, the variable delay inverter IV2 and the capacitor C2 supply the signal, which is obtained by reversing the logic level of the bit signal BS, to the inverter 52 in the next stage as the delayed reverse bit signal DDQ after delaying the signal by ½ of the delay time caused by the clock line CLL. That is, the variable delay inverter IV2 and the capacitor C2 may serve as the second delay section.

The capacitors C1 and C2 are made from the same material as that of the clock line CLL, and can be established using the fringe capacitance obtained by arranging a plurality of electrodes, parallel to each other, in the form of wiring in the same layer.

Figure 3:
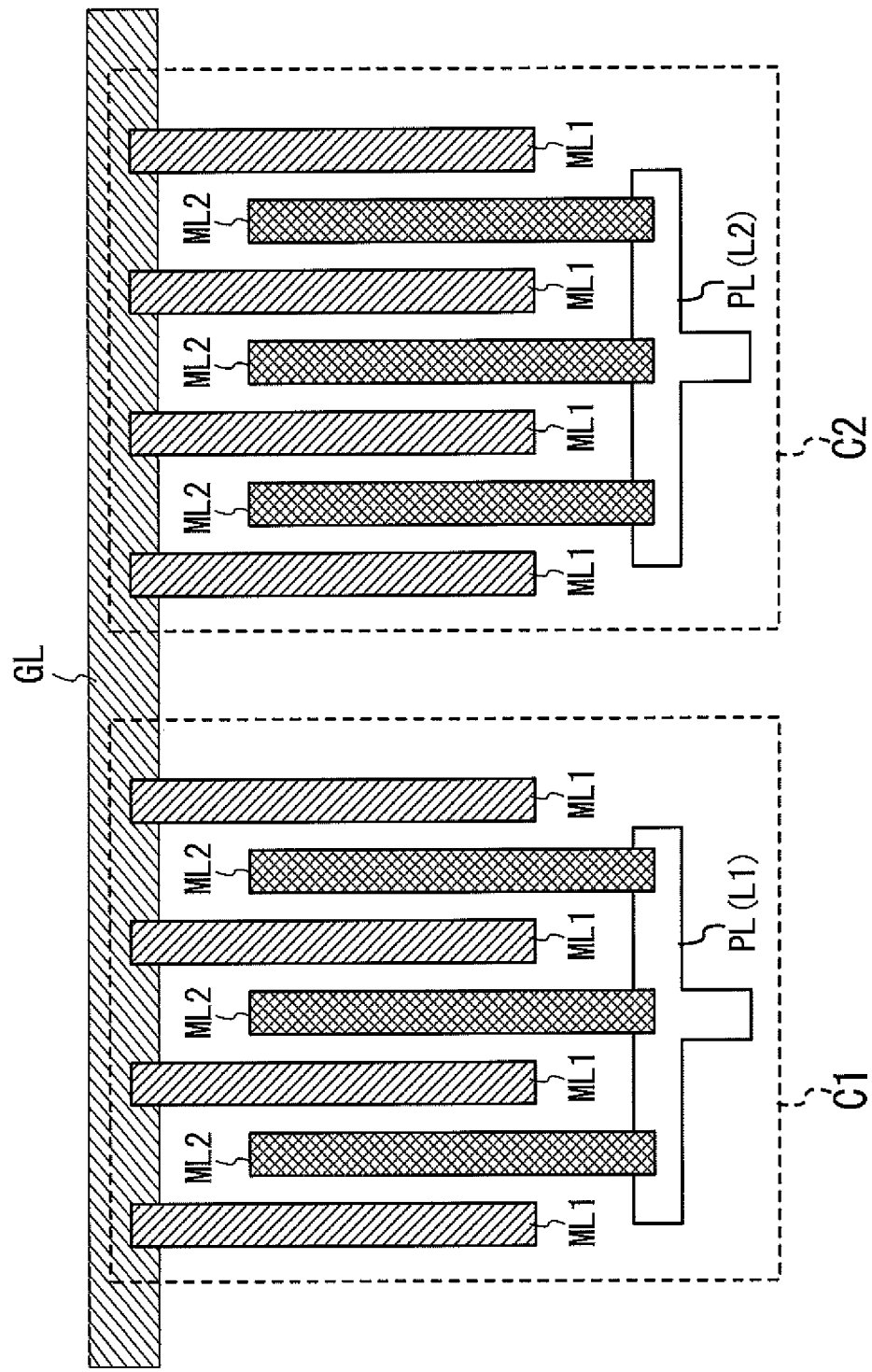
FIG. 3 is a plan view of two capacitors installed in the variable delay buffer shown in FIG. 2, as viewed from the top of a chip.

FIG. 3 is a plan view showing the structures of the capacitors C1 and C2.

As shown in FIG. 3, each of the capacitors C1 and C2 includes a ground metal line GL having a strip shape (elongated shape) to supply the ground voltage GND. Each capacitor C1, C2 also includes a comb-shape first electrode having a plurality of first metal lines ML1 connected to the ground metal line GL. The first metal lines ML1 extend in the direction perpendicular to the ground metal line GL. Each capacitor C1, C2 also includes a comb-shape second electrode having a plurality of second metal lines ML2 which are interposed between each two first metal lines ML1. Each capacitor C1, C2 also includes a metal line PL to which one ends of the second metal lines ML2 are connected. The first and second metal lines ML1 and ML2 are made from the same material as that of the clock line CLL. As shown in FIG. 3, the first and second metal lines ML1 and ML2 are arranged in parallel to each other. The metal line PL of the capacitor C1 shown in FIG. 3 may be the line L1 shown in FIG. 2, and the metal line PL of the capacitor C2 may be the line L2 shown in FIG. 2. The comb-shaped first and second electrodes are provided in the same layer of the semiconductor chip.

According to the structure shown in FIG. 3, the fringe capacitance between the first and second metal lines ML1 and ML2 may serve as the capacitance of the capacitors C1 and C2. Thus, the delay time can be changed by adjusting the capacitance through the control of the length and/or the number of the first metal lines ML1 constituting the first electrode and the second metal lines ML2 constituting the second electrode. As such, when the chip layout processing is preformed (will be described later), the variable delay inverter IV1 and capacitor C1 are prepared as a first pair and the variable delay inverter IV2 and capacitor C2 are prepared as a second pair in order to preset the length and/or the number of the first and second metal lines ML1 and ML2 such that each of the first and second pairs of variable delay inverter and capacitor (IV1+C1; IV2+C2) may serve as a delaying unit having the delay time corresponding to ½ of interconnect delay time caused by the clock line CLL. As described above, since the capacitors C1 and C2 are formed of a material the same as that of the clock line CLL, variations in the interconnect delay due to the variations in manufacture of the clock line CLL may be similarly reflected to the amount of the delay caused by the capacitors C1 and C2. Thus, the clock skew can be offset (counterbalanced) with high precision in the manufactured product.

Referring also to FIG. 1, the variable delay buffer 53 supplies the delayed reverse bit signal DDQ to the inverter 52 after delaying the reverse bit signal DQ received from the inverter 51 through the two stages of delay unit (one stage is a pair of the variable delay inverter IV1 and the capacitor C1, and another stage is a pair of the variable delay inverter IV2 and the capacitor C2) by the interconnect delay time caused by the clock line CLL. For instance, as the reverse bit signal DQ is supplied to the variable delay buffer 53 included in the delay circuit $5_1$, the variable delay buffer 53 delays the reverse bit signal DQ by the interconnect delay time caused by the clock line CLL connected between the inverters 1 and $2_1$ to supply the delayed reverse bit signal DDQ to the inverter 52 in the next stage. As the reverse bit signal DQ is supplied to the variable delay buffer 53 included in the delay circuit $5_{16}$, the variable delay buffer 53 delays the reverse bit signal DQ by the interconnect delay time caused by the clock line CLL connected between the inverters 1 and $2_{16}$ to supply the delayed reverse bit signal DDQ to the inverter 52 in the next stage.

In this manner, in order to offset the clock skew caused by the delay time of the two logic devices (inverters 1 and 2) included in the clock signal path connected between the clock pad PCD and each FF 3, each of the delay circuits $5_1$ to $5_{16}$ includes the first delay section, in which two logic devices (inverters 51 and 52) are connected to each other in series corresponding to the number of logic devices 1 and 2 included in the clock signal path.

Also, the variable delay buffer 53 is installed in each of the delay circuits $5_1$ to $5_{16}$ as the second delay section in order to offset the clock skew caused by the clock line CLL transmitting the clock signal to each of the FFs $3_1$ to $3_{16}$.

Therefore, if the data fetch section 10 including the delay circuits $5_1$ to $5_{16}$ as shown in FIG. 1 is employed, the input data bits $D_1$ to $D_{16}$ can be fetched from the FF $3_1$ to $3_{16}$ without generating the clock skew even if the clock line wiring lengths vary for the FFs $3_1$ to $3_{16}$.

According to the above-described structure, the clock signal path is designed appropriately if logic devices (inverters 1 and 2) having the waveform correction function are installed in the clock signal path. This is the only requirement. Thus, the design work may be facilitated and simplified, as compared with the design work that must prepare the clock tree to suppress the clock skew.

In the case that the interconnect delay time is increased due to the increased wiring length of the clock line CLL, the interconnect delay time can be offset by using only the variable delay buffer 53 having the structure as shown in FIG. 2. Therefore, the area occupied by the chips can be reduced as compared with a structure in which a plurality of inverters are connected with each other in series corresponding to the interconnect delay time.

In this manner, the data fetch module 10 can ensure the sufficient margin for the setup time and the hold time without the design for the clock tree structure to reduce the clock skew, and without the complicated design for matching the data line length between the data pads PD and the FF 3 with the clock line length. Therefore, the problem mentioned in the Description of the Related Art in this specification, i.e., the number of logic devices connected to each other in series as a combined delay unit may be increased due to the clock tree prepared to reduce the clock skew, is prevented. Also, it is not necessary to increase the wiring length of the data line with the wiring length of the clock line. As such, the area needed to arrange the chips is reduced in the present invention as compared with the Related Art.

The chip layout processing for the data fetch section 10 carried out by an LSI design support device (not shown) will be described with reference to the chip layout flowchart shown in FIG. 4.

Figure 5:
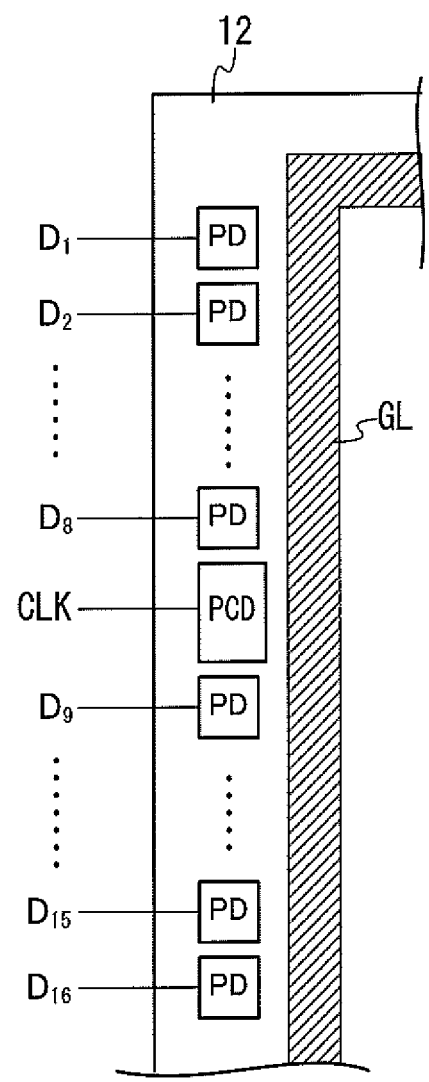
FIG. 5 illustrates an exemplary arrangement of data pads and a clock pad in the chip.
Figure 6:
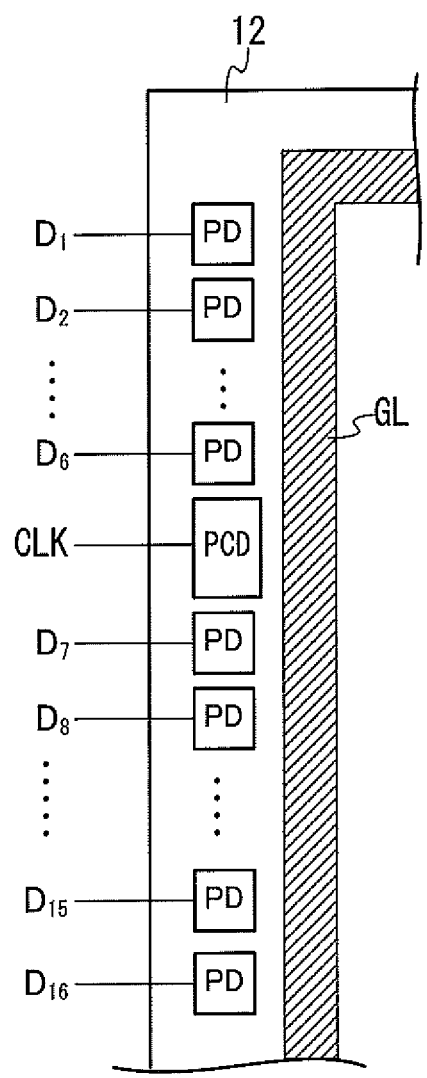
FIG. 6 illustrates another example of an arrangement of the data pads and the clock pad.

First, the LSI design support device decides the positions of the data pads PD corresponding to the input data bits $D_1$ to $D_{16}$ and the clock pad PCD corresponding to the input clock signal CLK on the semiconductor chip based on circuit diagram data of the data fetch section 10 shown in FIG. 1 (Step S1). As shown in FIG. 5, the LSI design support device arranges the sixteen data pads PD along the outer peripheral portion of the semiconductor chip corresponding to the input data bits $D_1$ to $D_{16}$ and also arranges the single clock pad PCD at the outer peripheral portion of the semiconductor chip corresponding to the input clock signal CLK. The clock pad PCD is placed in the middle of the sixteen data pads PD, i.e., between the data pad PD corresponding to the input data bit $D_8$ and the next data pad PD corresponding to the input data bit $D_9$. It should be noted, however, that the location of the clock pad PCD may not be limited to the center of the sixteen data pads PD. For example, as shown in FIG. 6, the clock pad PCD may be provided between the data pad PD corresponding to the input data bit $D_6$ and the next data pad PD corresponding to the input data bit $D_7$. It is sufficient so long as the clock pad PCD serving as the clock signal source is arranged between the two data pads PD serving as the source of the input data bit on the semiconductor chip. Due to the above-described arrangement of the data pads PD and the clock pad PCD, the longest wiring length in the clock signal path can be shortened, and therefore the maximum amount of the clock skew can be reduced.

Figure 7:
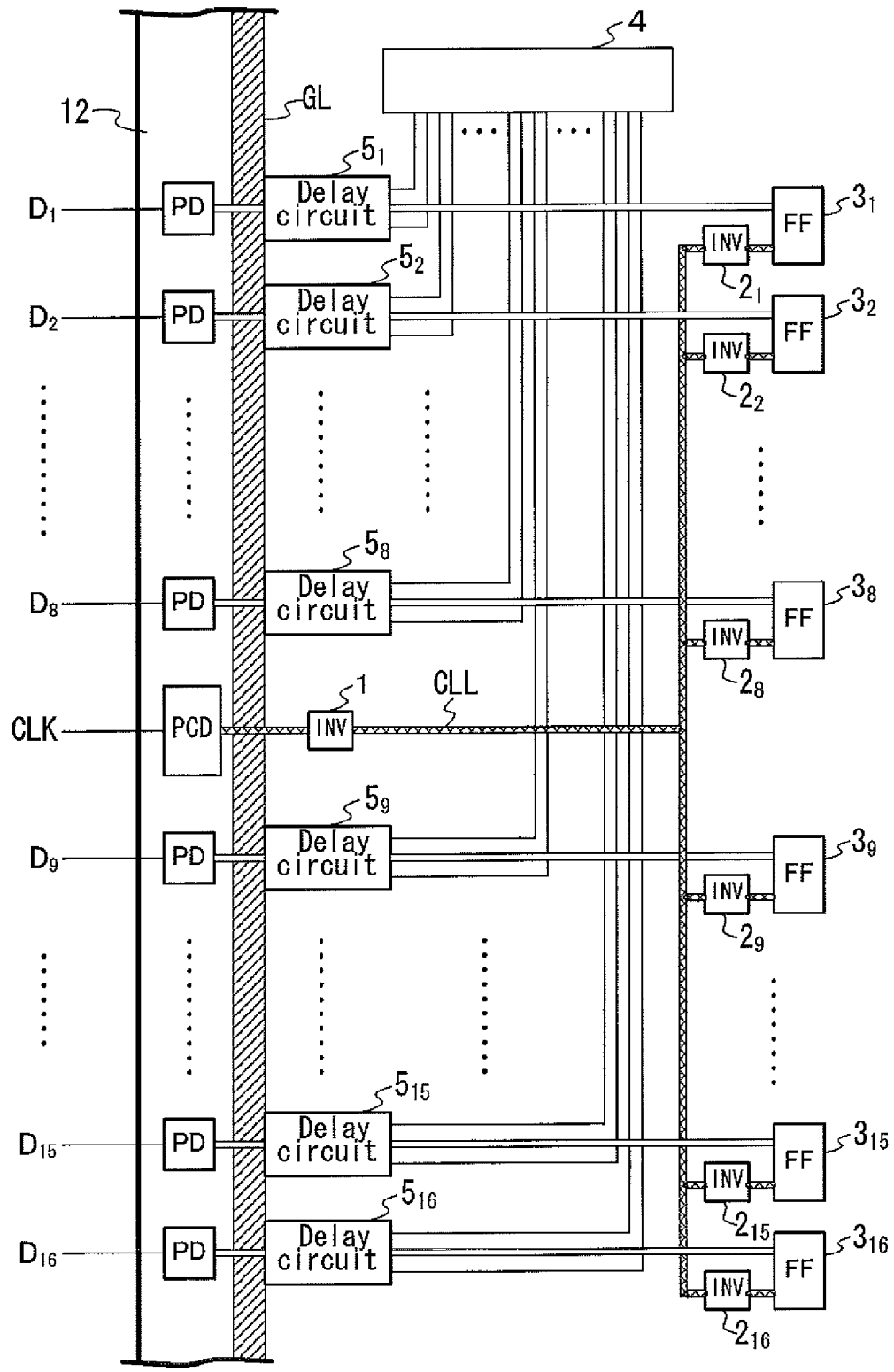
FIG. 7 shows an example of an arrangement of devices and elements on the chip and their interconnect in the data fetch section shown in FIG. 1.

Then, as shown in FIG. 7, the LSI design support device decides the positions of the delay circuits $5_1$ to $5_{16}$ and FFs $3_1$ to $3_{16}$ adjacent to the data pads PD corresponding to the input data bits $D_1$ to $D_{16}$, and the position of the inverter 1 adjacent to the clock pad PCD. The LSI design support device decides the positions of the inverters $2_1$ to $2_{16}$ adjacent to the FFs $3_1$ to $3_{16}$ and the position of the delay time setting part 4 (Step S2).

After that, as shown in FIG. 7, the LSI design support device decides the line (wiring) patterns that interconnect among the data pads PD, the delay circuit 5 and the FF 3, between the delay time setting part 4 and the delay circuit 5, between the clock pad PC and the inverter 1, between the FFs $3_1$ to $3_{16}$ and the inverters $2_1$ to $2_{16}$ and between the inverter 1 and the inverters $2_1$ to $2_{16}$ by using the clock line CLL (Step S3).

Then, the LSI design support device measurers the length of the clock line CLL in each of the FFs $3_1$ to $3_{16}$ and calculates interconnect delay time $HDT_1$ to $HDT_{16}$ based on the parasitic capacitance and resistance corresponding to the line length in each of the FFs $3_1$ to $3_{16}$ (Step S4).

After that, for each of the interconnect delay times $HDT_1$ to $HDT_{16}$, the LSI design support device calculates the constant current bias voltages $CP_1$ to $CP_{16}$ and $CN_1$ to $CN_{16}$ corresponding to ½ of the respective interconnect delay time HDT (Step S5).

Then, the LSI design support device establishes the devices of the delay time setting part 4 to generate the constant current bias voltages $CP_1$ to $CP_{16}$ and $CN_1$ to $CN_{16}$ calculated in step S5 (Step S6). For instance, the LSI design support device establishes the MOS transistors as the delay time setting part 4 to generate the constant current bias voltages $CP_1$ to $CP_{16}$ and $CN_1$ to $CN_{16}$. Also, the LSI design support device establishes, in the delay time setting part 4, a bias voltage generation circuit for generating a plurality of constant current bias voltages having different voltage values, and 16-route multiplexers for selecting one of the constant current bias voltages to output the selected constant current bias voltage CP or CN. The LSI design support device may change (or adjust) the layout of each multiplexer to fixedly select the constant current bias voltages calculated in step S5.

After that, the LSI design support device establishes devices of the capacitors C1 and C2 of the variable delay buffer 53 installed in each of the delay circuits $5_1$ to $5_{16}$, based on the delay time corresponding to ½ of each of the interconnect delay times $HDT_1$ to $HDT_{16}$ (Step S7). That is, the LSI design support device decides the length and/or the number of the first and second metal lines ML1 and ML2 (FIG. 3) in such a manner that one pair of the variable delay inverter IV and the capacitor C may serve as the delay unit having the delay time of HDT/2 when the constant current bias voltages CP and CN are supplied to the variable delay inverter IV1 or IV2. It should be noted that the length and/or the number of the first and second metal lines ML1 and ML2, which is initially set, may be changed (adjusted) on the basis of the constant current bias voltages CP and CN. The ground metal line GL (FIG. 7) extends adjacent to the data pads PD, and the capacitors C1 and C2 are provided along the ground metal line GL as shown in FIG. 3.

As described above, even if the clock line lengths vary in the FFs $3_1$ to $3_{16}$, the clock-synchronous data fetch section 10 that can avoid the clock skew is established through the above-described chip layout processing.

In this embodiment, the delay time of each variable delay buffer 53 in each delay circuit 5 is individually adjusted based on the interconnect delay time $HDT_1$ to $HDT_{16}$ of the FFs $3_1$ to $3_{16}$ to reduce the clock skew to approximate 0. It should be noted, however, that so long as the hold time and the setup time of the FFs $3_1$ to $3_{16}$ stay within a desired range, the delay time of each variable delay buffer 53 in the delay circuits $5_1$ to $5_{16}$ may be adjusted to the same value by using one of the interconnect delay time $HDT_1$ to $HDT_{16}$. This modification will be described below with reference to FIG. 8 to FIG. 10.

Figure 8:
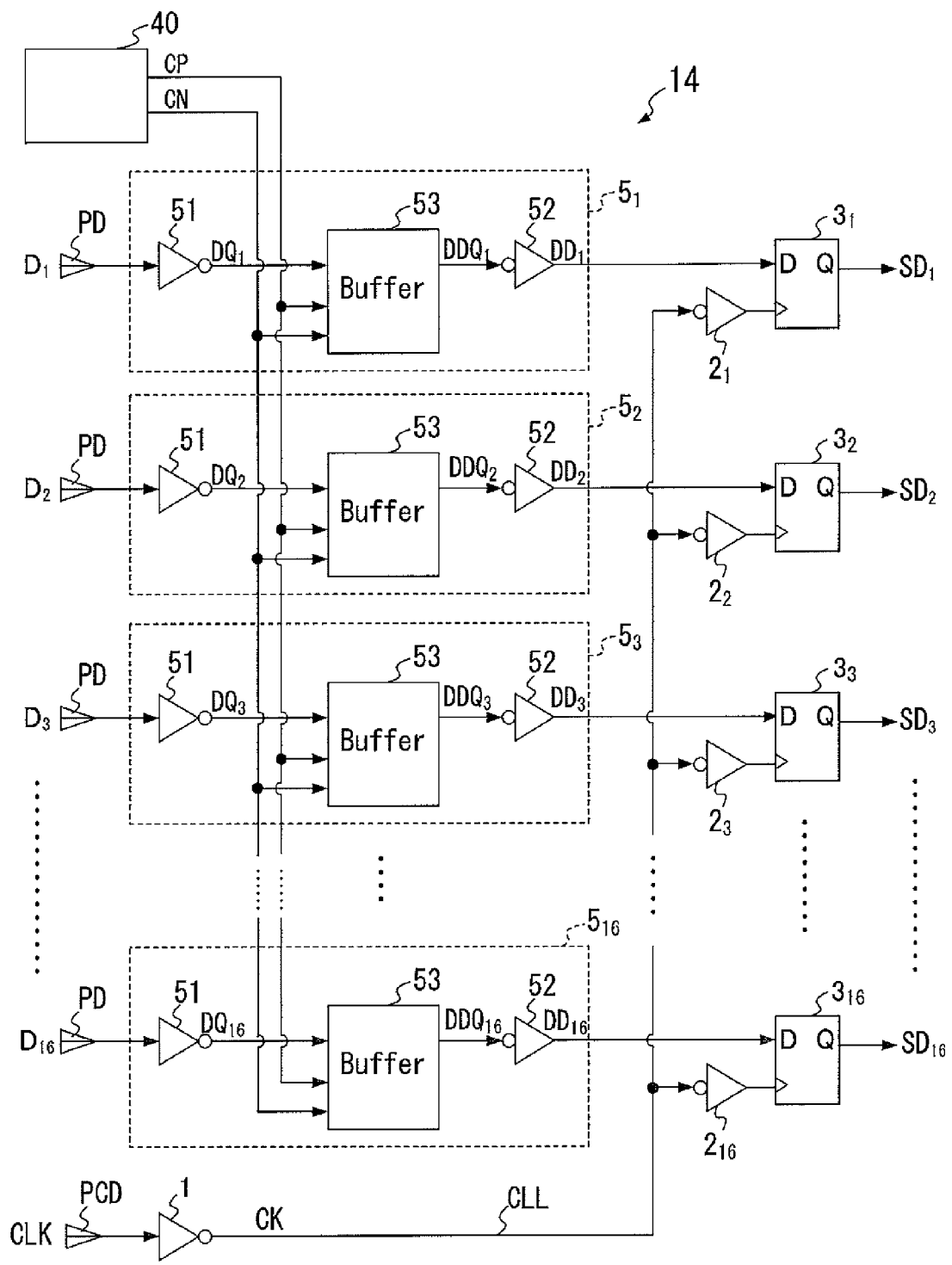
FIG. 8 is a circuit diagram showing another example of a data fetch section.
Figure 9:
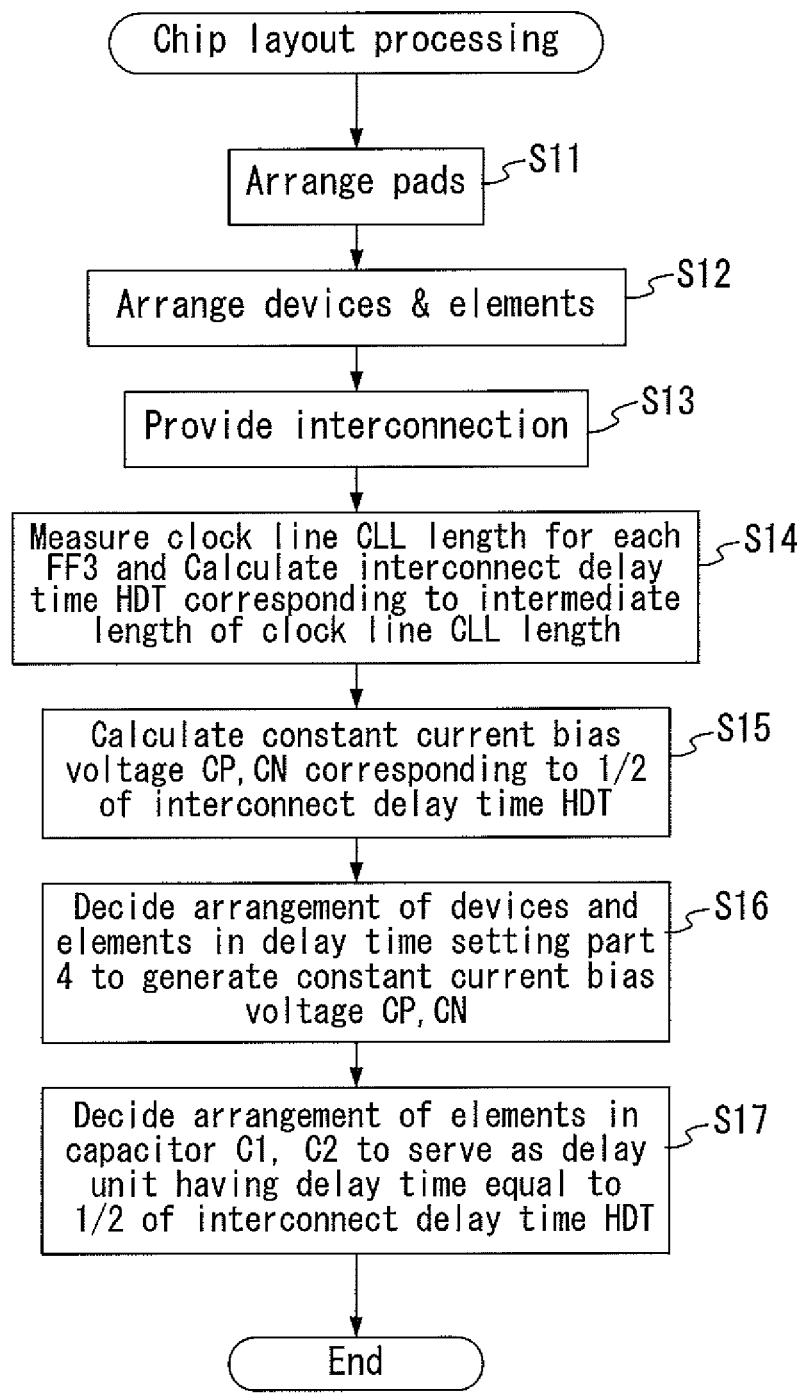
FIG. 9 is a flowchart showing the procedure of a chip layout processing to establish the data fetch section shown in FIG. 8.
Figure 10:
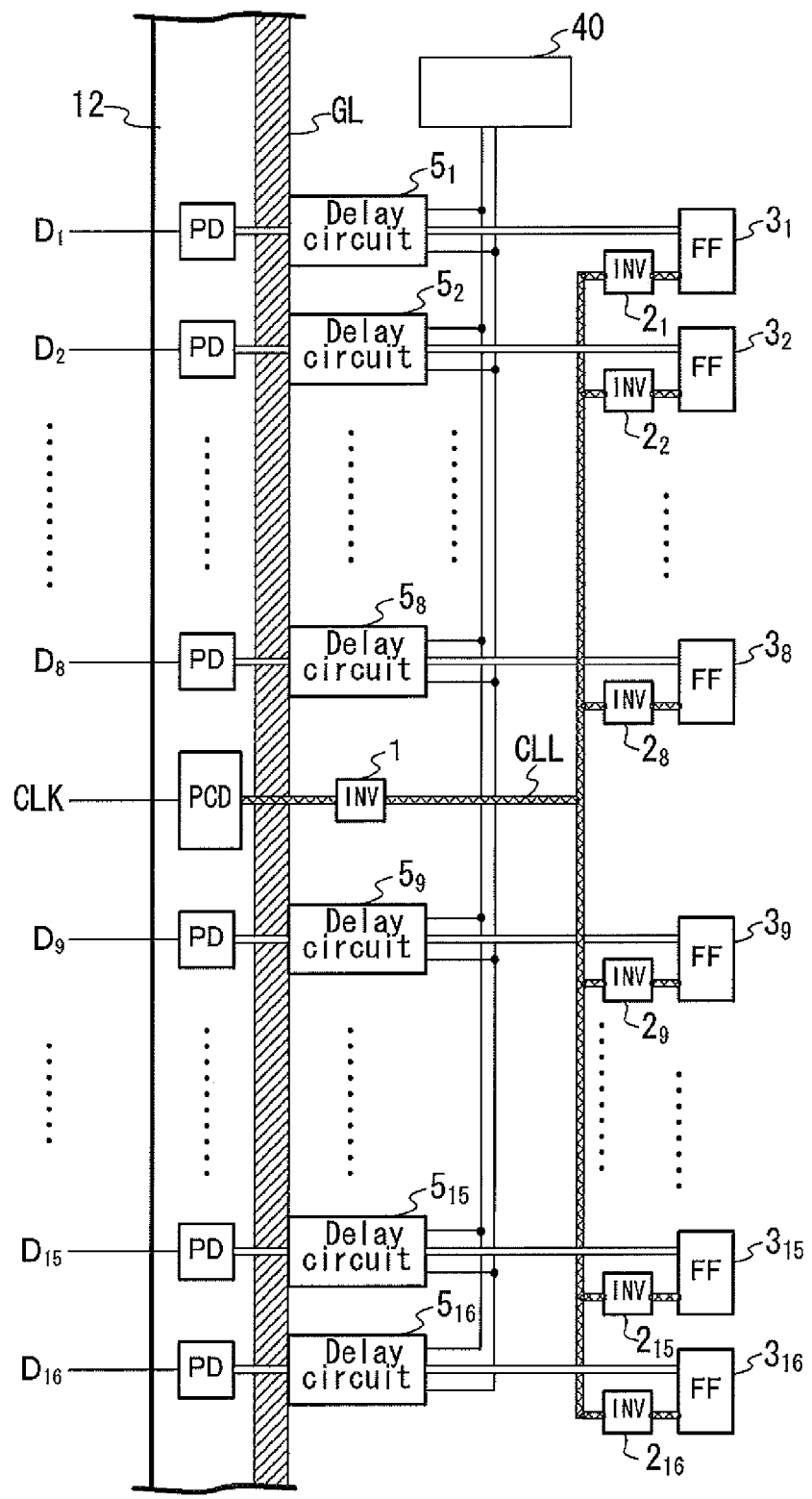
FIG. 10 shows an example of an arrangement of devices and elements on the chip and their interconnect in the data fetch section shown in FIG. 8.

Referring to FIG. 8 to FIG. 10, another example of the data fetch section, which is a modification to the data fetch section 10 shown in FIG. 1, will be described.

The data fetch section 14 shown in FIG. 8 is similar to the data fetch section 10 shown in FIG. 1 except that a delay time setting part 40 is employed instead of the delay time setting section 4 (FIG. 7), and the constant current bias voltages CP and CN are commonly supplied to each variable delay buffer of the delay circuits $5_1$ to $5_{16}$. The delay time setting part 40 generates the constant current bias voltages CP and CN corresponding to the amount of delay in each of the delay circuits $5_1$ to $5_{16}$ and supplies the constant current bias voltages CP and CN to each variable delay buffer 53 of the delay circuits $5_1$ to $5_{16}$.

Figure 4:
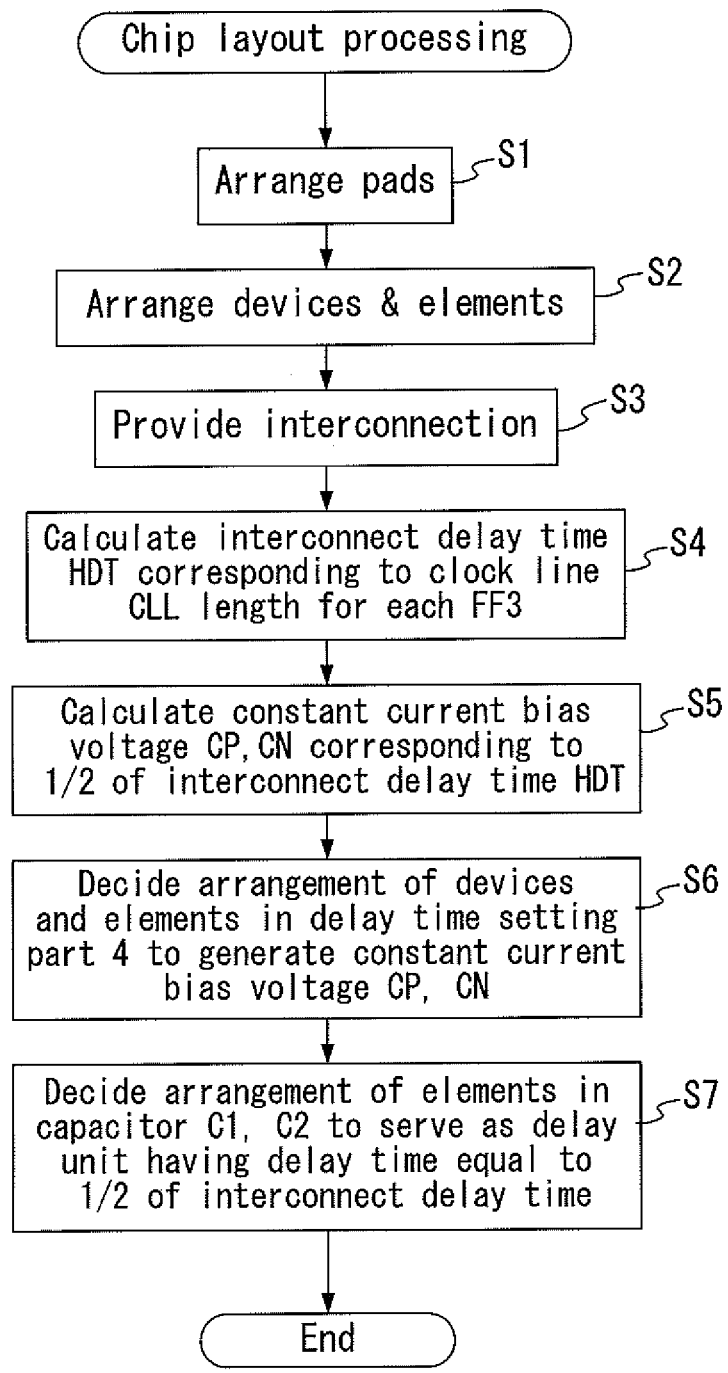
FIG. 4 is a flowchart showing the procedure of a chip layout processing to establish the data fetch section shown in FIG. 1.

If the structure shown in FIG. 8 is employed, the LSI design support device carries out the chip layout processing for the data fetch section 14 according to the chip layout flowchart shown in FIG. 9 instead of the chip layout flowchart shown in FIG. 4.

First, the LSI design support device decides the arrangement (positions) of the data pads PD corresponding to the input data bits $D_1$ to $D_{16}$ and the clock pad PCD corresponding to the input clock signal CLK as shown in FIG. 5 or 6 on the semiconductor chip based on circuit diagram data of the data fetch section 14 shown in FIG. 8 (Step S11).

Then, as shown in FIG. 10, the LSI design support device decides the positions of the delay circuits $5_1$ to $5_{16}$ and FFs $3_1$ to $3_{16}$ adjacent to the data pads PD corresponding to the input data bits $D_1$ to $D_{16}$, and the position of the inverter 1 adjacent to the clock pad PCD. The LSI design support device also decides the positions of the inverters $2_1$ to $2_{16}$ adjacent to the FFs $3_1$ to $3_{16}$ and the position of the delay time setting part 40 (Step S12).

After that, as shown in FIG. 10, the LSI design support device decides the line patters to interconnect among the data pads PD, the delay circuit 5 and the FF 3, between the delay time setting part 40 and the delay circuit 5, between the clock pad PC and the inverter 1, between the FFs $3_1$ to $3_{16}$ and the inverters $2_1$ to $2_{16}$ and between the inverter 1 and the inverters $2_1$ to $2_{16}$ by using the clock line CLL (Step S13).

Then, the LSI design support device measurers the wiring length of the clock line CLL in each of the FFs $3_1$ to $3_{16}$ and calculates the interconnect delay time HDT based on the parasitic capacitance and resistance corresponding to the intermediate line length (Step S14).

After that, the LSI design support device calculates the constant current bias voltages CP and CN corresponding to ½ of the interconnect delay time HDT (Step S15).

Then, the LSI design support device establishes the devices of the delay time setting part 40 in order to generate the constant current bias voltages CP and CN calculated in step S15 (Step S16). For instance, the LSI design support device establishes the delay time setting part 40 having a bias voltage generation circuit for generating a plurality of constant current bias voltages having voltage values different from each other, and a multiplexer for selecting one of the constant current bias voltages to issue the selected bias voltage as the constant current bias voltage CP or CN. The LSI design support device may adjust the layout (position) of each multiplexer to fixedly select the constant current bias voltages calculated in step S15.

After that, the LSI design support device calculates the delay time corresponding to ½ of the interconnect delay time HDT and establishes devices of the capacitors C1 and C2 of the variable delay buffer 53 installed in each of the delay circuits $5_1$ to $5_{16}$ in such a manner that the capacitors C1 and C2 may serve as the delay unit having the delay time of HDT/2 (Step S17). Specifically, the LSI design support device decides the length and/or the number of the first and second metal lines ML1 and ML2 (FIG. 3) in such a manner that one pair of the variable delay inverter IV and the capacitor C may serve as the delay unit having the delay time of HDT/2 when the constant current bias voltages CP and CN are supplied to the variable delay inverter IV1 or IV2. Alternatively, the length and/or the number of the first and second metal lines ML1 and ML2, which is initially set, may be adjusted based on the constant current bias voltages CP and CN.

According to the chip layout processing shown in FIG. 9, the delay circuits $5_1$ to $5_{16}$ may serve as the delay unit having the intermediate delay time between the interconnect delay time in the clock signal path where the clock line length is the longest and the interconnect delay time in the clock signal path where the clock line length is the shortest.

Therefore, even if the clock line lengths vary in the FFs $3_1$ to $3_{16}$, the FFs $3_1$ to $3_{16}$ can fetch data corresponding to the clock signals in the hold time and the setup time.

If the structure shown in FIG. 8 is employed, only two lines are necessary to transmit the constant current bias voltages CP and CN to the delay circuits $5_1$ to $5_{16}$. Thus, the chip area (footprint) can be reduced as compared with the configuration shown in FIGS. 1 and 7, in which 32 lines are necessary to transmit constant current bias voltages $CP_1$ to $CP_{16}$ and $CN_1$ to $CN_{16}$.

According to the configuration shown in FIGS. 8 and 10, the amount of the clock skew in the FFs $3_1$ and $3_{16}$ where the length of the clock line CLL is the longest is different from the amount of the clock skew FFs $3_8$ and $3_9$ where the length of the clock line CLL is the shortest.

Therefore, one or more delay devices or elements may be inserted between the delay circuit 5 and the FF 3 and between the inverter 2 and the FF 3 in order to compensate for the variation of the clock skew caused by the difference in the line length. This modification will be described with reference to FIG. 11.

Figure 11:
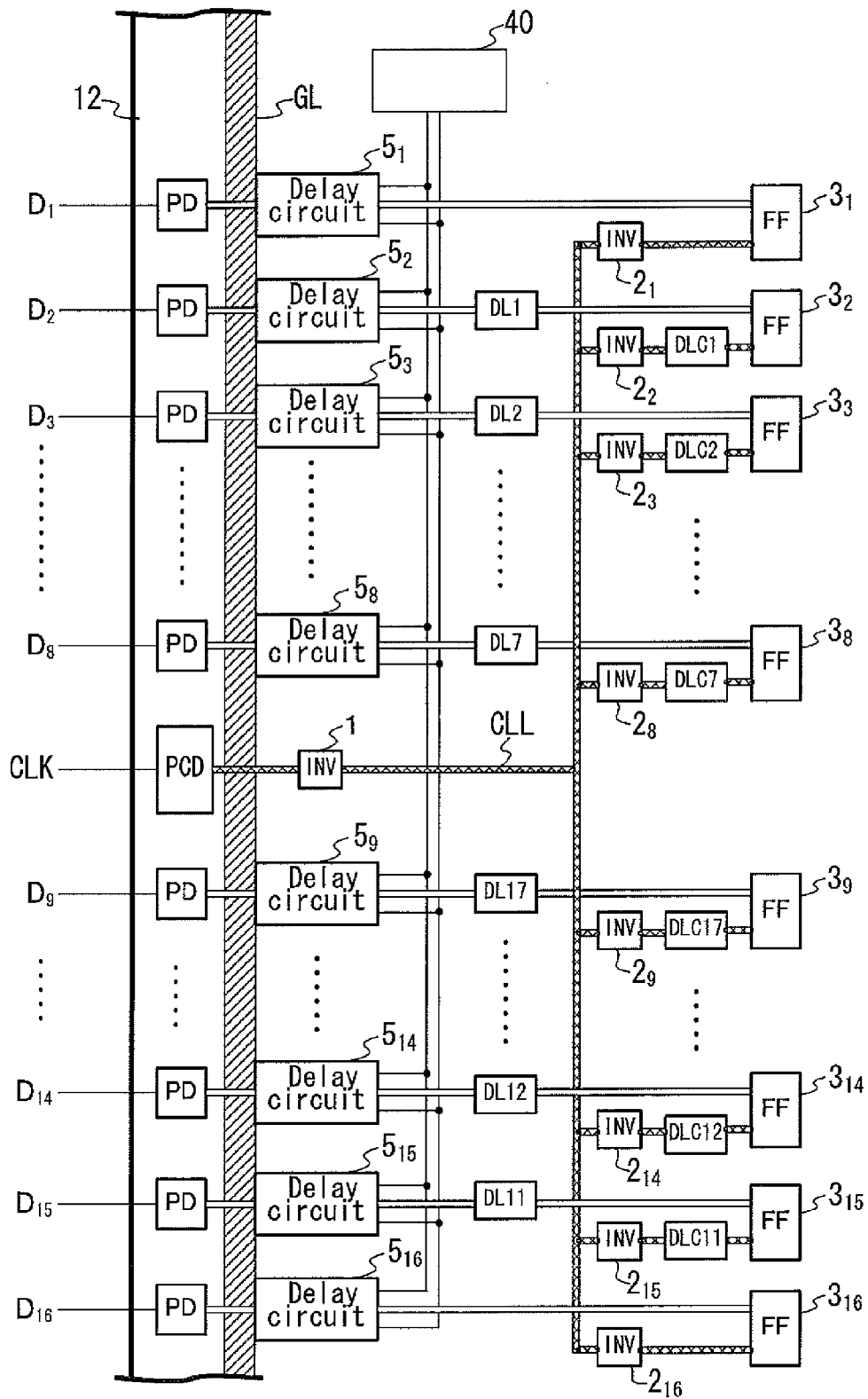
FIG. 11 illustrates another example of an arrangement of devices and elements on the chip and their interconnect in the data fetch section shown in FIG. 8.

FIG. 11 shows a modification to the configuration shown in FIG. 10.

Referring to FIG. 11, delay devices DL1 to DL7 are inserted between the delay circuits $5_2$ to $5_8$ and FFs $3_2$ to $3_8$, respectively, and delay devices DL11 to DL17 are inserted between the delay circuits $5_{15}$ to $5_9$ and FFs $3_{15}$ to $3_9$, respectively. Also, delay devices DLC1 to DLC7 are inserted between the inverters $2_2$ to $2_8$ and FFs $3_2$ to $3_8$, respectively, and delay devices DLC11 to DLC17 are inserted between the inverters $2_{15}$ to $2_9$ and FFs $3_{15}$ to $3_9$, respectively. No delay device is inserted with respect to the FF $3_1$ and FF $3_{16}$ where the length of the clock line CLL is the longest.

Each of the delay devices DL1 and DLC1 may serve as a delay device having a delay time corresponding to difference between the maximum interconnect delay time caused by the clock line CLL between the inverters 1 and $2_1$ and the interconnect delay time caused by the clock line CLL between the inverters 1 and $2_2$. Each of the delay devices DL2 and DLC2 may serve as a delay device having a delay time corresponding to difference between the maximum interconnect delay time and the interconnect delay time caused by the clock line CLL between the inverters 1 and $2_3$. Each of the delay devices DL3 and DLC3 may serve as a delay device having a delay time corresponding to difference between the maximum interconnect delay time and the interconnect delay time caused by the clock line CLL between the inverters 1 and $2_4$. Each of the delay devices DL11 and DLC11 may serve as a delay device having a delay time corresponding to difference between the maximum interconnect delay time caused by the clock line CLL between the inverters 1 and $2_{16}$ and the interconnect delay time caused by the clock line CLL between the inverters 1 and 2$_{15}$. Each of the delay devices DL12 and DLC12 may serve as a delay device having a delay time corresponding to difference between the maximum interconnect delay time and the interconnect delay time caused by the clock line CLL between the inverters 1 and 2$_{14}$. Each of the delay devices DL13 and DLC13 may serve as a delay device having a delay time corresponding to difference between the maximum interconnect delay time and the interconnect delay time caused by the clock line CLL between the inverters 1 and 2$_{13}$. It should be noted that the delay devices DL1 to DL7, DLC1 to DLC7, DL11 to DL17 and DLC11 to DLC17 may be prepared by connecting logic devices, such as inverters, OR gates or AND gates, in series to obtain a desired amount of delay.

According to the structure shown in FIG. 11, the clock skew of the FFs 3$_1$ to 3$_{16}$ can be set to approximate 0. Thus, the margin for the hold time and the setup time can be increased as compared with the structure shown in FIG. 10.

In order to obtain the delay time corresponding to the interconnect delay time, the variable delay inverter IV1 and the capacitor C1 of the variable delay buffer 53 shown in FIG. 2 take 50% of the interconnect delay time, and the variable delay inverter IV2 and the capacitor C2 take the remaining 50% of the interconnect delay time. It should be noted, however, that the present invention is not limited to this "50% vs. 50%" configuration. The variable delay inverter IV1 and the capacitor C1 may take suitable N % (N is positive real number) of the interconnect delay time, and the variable delay inverter IV2 and the capacitor C2 may take the remaining (100-N) % of the interconnect delay time.

In the variable delay buffer 53 shown in FIG. 2, the two variable delay inverters IV1 and IV2 are connected to each other in series because the same delay time is applied to both the rising edge part and the falling edge part of the data. However, it is also possible to employ one variable delay inverter or at least three variable delay inverters connected to each other in series. When the number of the variable delay inverter (s) IV serving as the charge/discharge controller is K (K is a positive integer), the amount of delay by one pair of the variable delay inverter IV and the capacitor C is set to 1/K of the amount of the delay based on the clock line length.

In the above-described embodiments, the data pads PD are used as the sources for supplying the input data bits D$_1$ to D$_{16}$, but upstream latch circuits (flip flops) may be used as the sources for the data bits D$_1$ to D$_{16}$.

Although the inverter 51 is provided upstream of the variable delay buffer 53 and the inverter 52 is provided downstream of the variable delay buffer 53 in the delay circuit 5 shown in FIGS. 1 and 8, the arrangement of the inverter 51, the variable delay buffer 53 and the inverter 52 may not be limited to the one illustrated in FIGS. 1 and 8. For instance, the inverters 51 and 52 may be directly connected to each other and the variable delay buffer 53 may be installed upstream of the inverters 51 and 52. Alternatively, the inverters 51 and 52 may be directly connected to each other and the variable delay buffer 53 may be installed downstream of the inverters 51 and 52.

This application is based on Japanese Patent Application No. 2011-25807 filed on Feb. 9, 2011, and the entire disclosure thereof is incorporated herein by reference.

What is claimed is:

1. A semiconductor chip comprising:
    a plurality of latch circuits for fetching data bits in synchronization with a clock signal;
    a plurality of data pads associated with the plurality of latch circuits respectively, and arranged along an outer periphery of the semiconductor chip;
    a clock pad arranged along the outer periphery of the semiconductor chip;
    a clock line having a plurality of sub-lines to respectively connect the latch circuits with the clock pad;
    a plurality of data lines to connect the latch circuits with the data pads respectively;
    a plurality of first waveform shaping devices associated with the plurality of latch circuits respectively, each said first waveform shaping device being connected between the associated latch circuit and the clock pad;
    a plurality of second waveform shaping devices associated with the plurality of latch circuits respectively, each said second waveform shaping device being connected between the associated latch circuit and the associated data pad;
    a plurality of delay circuits associated with the plurality of latch circuits respectively, each said delay circuit being connected between the associated latch circuit and the associated data pad, each said delay circuit having an amount of delay corresponding to an amount of charge/discharge current supplied to an associated capacitor; and
    a ground line connected to one end of each said capacitor, wherein the ground line extends along the outer periphery of the semiconductor chip between the data pads and the delay circuits.

2. The semiconductor chip according in claim 1, wherein each said capacitor is defined by a capacitance between lines formed on a same layer.

3. The semiconductor chip according to claim 2, wherein each said capacitor includes electrodes configured in a comb-teeth shape.

4. The semiconductor chip according to claim 1, wherein a material of each said capacitor is the same as material of the clock line.

* * * * *